United States Patent [19]

Spanjer et al.

[11] Patent Number: 4,946,518
[45] Date of Patent: Aug. 7, 1990

[54] METHOD FOR IMPROVING THE ADHESION OF A PLASTIC ENCAPSULANT TO COPPER CONTAINING LEADFRAMES

[75] Inventors: Keith G. Spanjer; Dervin L. Flowers, both of Scottsdale, Ariz.

[73] Assignee: Motorola, Inc., Schaumburg, Ill.

[21] Appl. No.: 322,845

[22] Filed: Mar. 14, 1989

[51] Int. Cl.$^5$ .................. C23F 3/02; H01L 21/48; H01L 21/56
[52] U.S. Cl. .................. 148/282; 148/276; 148/284; 264/272.17
[58] Field of Search .......... 148/282, 269, 276, 284; 264/272.17

[56] References Cited

U.S. PATENT DOCUMENTS

| | | | |
|---|---|---|---|
| 3,434,889 | 3/1969 | Haroldson | 148/282 |
| 3,992,230 | 11/1976 | Komiyama | 148/282 |
| 4,328,048 | 5/1982 | Senda | 148/282 |
| 4,534,921 | 8/1985 | Fierkens | 264/272.17 |
| 4,582,556 | 4/1986 | Butt | 264/272.17 |
| 4,641,418 | 2/1987 | Meddles | 264/272.17 |
| 4,822,550 | 4/1989 | Komathu | 264/272.17 |

FOREIGN PATENT DOCUMENTS

| | | | |
|---|---|---|---|
| 128297 | 6/1919 | United Kingdom | 148/282 |
| 2086134 | 5/1982 | United Kingdom | 148/282 |

*Primary Examiner*—Jay H. Woo
*Assistant Examiner*—Jeremiah Durkin, II
*Attorney, Agent, or Firm*—Robert M. Handy

[57] ABSTRACT

The adhesion of plastic encapsulants to electrical leadframes containing substantial amounts of copper is improved by exposing the leadframes to an active oxygen ambient (e.g., 10–30% $H_2O_2$) at temperatures below the leadframe annealing temperature (e.g., room temperature to 100° C.) for a few minutes. There is no need to remove the native oxide. A preliminary degreasing step is desirable but not essential. The treatment strengthens any native oxide present on the leadframes without producing an oxide which is so thick as to interfere with subsequent bonding of electronic components or connecting wires to the leadframe. Delamination between the leadframe and the plastic encapsulant by temperture cycling from −65° to 150° C. is substantially reduced.

10 Claims, 1 Drawing Sheet

METHOD FOR IMPROVING THE ADHESION OF A PLASTIC ENCAPSULANT TO COPPER CONTAINING LEADFRAMES

FIELD OF THE INVENTION

This invention concerns the manufacture of plastic encapsulated electrical devices mounted on copper containing leadframes and, more particularly, a method for improving the adhesion of the plastic encapsulant to the leadframe to reduce the incidence of delamination.

In the electrical industry, particularly the electronic industry, copper containing leadframes are much used as supports for electrical components, especially semiconductor components. Plastic encapsulants are used to provide environmental protection to the finished device.

Power transistors or thyristors are typical examples of plastic encapsulated devices using copper containing leadframes. A semiconductor die containing the desired transistor or thyristor is mounted on the die flag portion of the leadframe and various connecting wires are bonded between the die bonding pads and the leadframe bonding pads. Plastic is then molded over the portion of the leadframe containing the semiconductor die and interconnecting wires to provide mechanical and environmental protection.

In many cases, particularly with power devices, the die mounting flag has a large flat area in order to provide for efficient heat removal. Frequently this large die mounting flag extends beyond the plastic encapsulant and/or has one face exposed so that it may be readily attached to a heat sink. In other cases the large area die flag is completely surrounded by plastic to provide complete electrical isolation thereof.

A particular problem with these and other plastic encapsulated devices involving comparatively large flat metal regions is delamination of the plastic encapsulant therefrom. Delamination occurs typically following temperature cycling (e.g. $-65°$ to $150°$ C.) and is caused by the differential thermal coefficient of expansion (DTCE) between the plastic encapsulant and the leadframe. The DTCE is generally larger when leadframes containing substantial amounts (e.g., $\geq 50\%$) of copper are utilized and is particularly severe with substantially pure copper leadframes.

In the past, various mechanical features (grooves, notches, hatching, holes, etc.) have been used to lock the plastic to the leadframe and reduce delamination. However, for certain types of devices, such mechanical features are insufficient to prevent delamination or cannot be used and delamination remains a problem.

An alternate method used in the prior art is to pass the leadframes through a hot reducing atmosphere after mounting of the electronic components and immediately prior to encapsulation so as to remove any surface oxide and permit direct bonding of the plastic to clean metal. However, this adds extra cost and is not suitable for use with many components which will not withstand the reducing atmosphere and/or the temperatures required.

A further prior art method is to remove any surface oxide prior to mounting the electronic components, typically by an acid dip, and then coat the leadframe with an organic material such as an acrylic monomer to prevent re-oxidation during assembly and encapsulation. This also provides a direct plastic-metal bond. However, this process adds extra cost and is more complicated to use in manufacturing since the monomer protects the leadframes from oxidation for only a limited time.

Accordingly, it is an object of this invention to provide improved bonding strength between leadframes containing substantial amounts of copper and plastic encapsulants thereon, and which is suitable for use with semiconductor and other electronic components.

It is a further object of this invention to provide such improved bonding strength independent of the mechanical features of the leadframe and in a manner that tolerates native oxide which may have formed during assembly of the electronic components on the leadframe.

As used herein, the words "active oxidant" are intended to refer to atmospheres or solutions in which dissociation of the oxidizing species has occurred.

BRIEF SUMMARY OF THE INVENTION

The foregoing and other objects and advantages are achieved through an improved process comprising providing a copper containing leadframe having a first portion for external connection and a second portion for receiving an electrical component, exposing the leadframe to an active oxidant at a temperature less than the leadframe annealing temperature, and thereafter encapsulating at least part of the second portion of the leadframe in a plastic.

A convenient active oxidant is a water solution containing 10–30% $H_2O_2$. Immersion time in the range of 1–30 minutes is suitable with 5–15 minutes being convenient. Temperatures less than about $100°$ C. are suitable with room temperature being convenient. It is desirable that the oxidant be substantially chlorine free. An oxygen containing plasma wherein the leadframe remains below its annealing temperature is also a suitable active oxidant. It is desirable but not essential to degrease the leadframe prior to exposure to the active oxidant. The foregoing process results in substantially higher plastic-leadframe bonding strength and less delamination than with leadframes having native oxides and not so treated.

The invented method will be better understood by considering the accompanying drawings and description that follows.

DETAILED DESCRIPTION OF THE DRAWINGS

Figure 1:
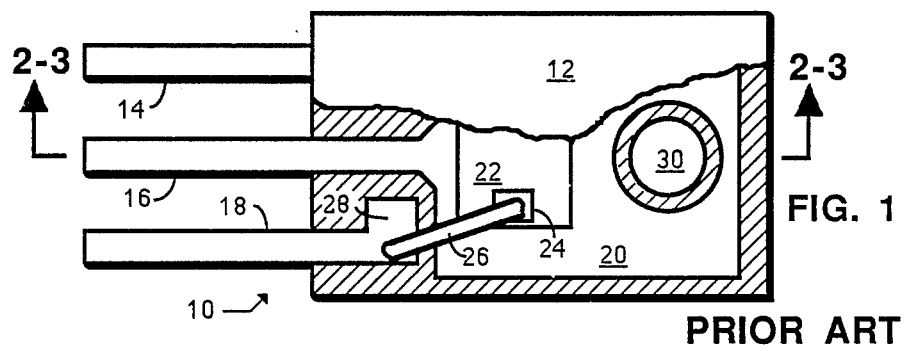
FIG. 1 shows a top and partially cut-away view of a typical plastic encapsulated power semiconductor device.

FIG. 1 shows a top and partial cut-away view of semiconductor power device 10 having plastic body 12 and leads 14, 16, 18. For convenience of understanding, the portion of the plastic body exposed in the cut-away view of FIG. 1 has been hatched. Lead 16 comprises die flag 20 on which is mounted semiconductor die 22, e.g., a transistor, having bonding pad 24 to which is connected bonding wire 26 extending to bonding portion 28 of lead 18. Hole 30 is provided to permit attachment of device 10 to a suitable heat sink (not shown). Means and methods for constructing device 10 are well known in the art.

Figure 2:
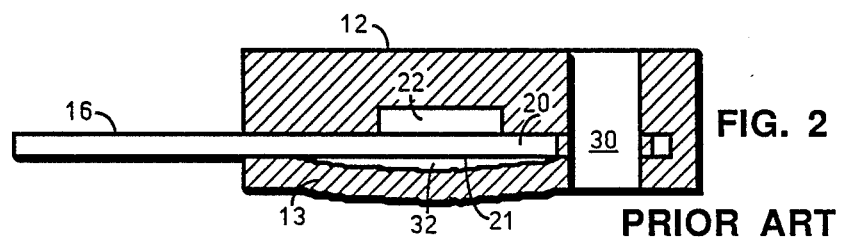
FIG. 2 shows a cross-sectional view through the device of FIG. 1 illustrating delamination.
Figure 3:
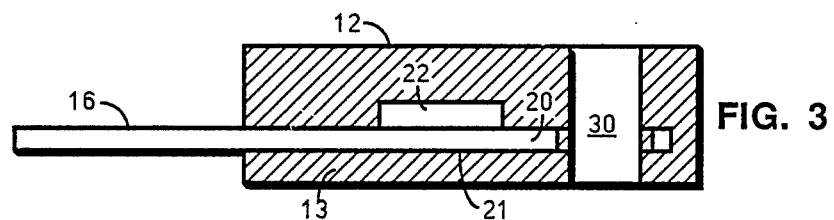
FIG. 3 shows the same device as in FIG. 2 but according to the present invention wherein delamination has been prevented.

FIGS. 2–3 show simplified cross-sectional views through the device of FIG. 1 at the indicated position. For convenience of understanding, the portion of the plastic body exposed in the cross-sections of FIGS. 2–3 has been hatched, while the metal leadframe, transistor die and delamination bubble have been left clear. Device 10 is of the type wherein plastic encapsulation 12 substantially surrounds die flag 20. Portion 13 of plastic encapsulant 12 is located below die flag 20 so as to provide electrical isolation of die flag 20 from the heat sink or other structure (not shown) to which device 10 is intended to be mounted.

FIG. 2 illustrates the situation where delamination has occurred between portion 13 of encapsulant 12 and lower surface 21 of die flag 20 allowing bubble 32 to form therebetween. Bubble 32 contains gasses which evolve from plastic encapsulant 12 and may contain ambient atmosphere if the delamination crack extends to an exterior surface of encapsulant 12. It has been found that copper containing leadframes, especially those with 50% or more copper and especially those which are substantially pure copper, that have been exposed to ambient air prior to molding, sometimes exhibit delamination failure on temperature cycling. Temperature cycling is typically done over the range −65° to 150° C. or less using means and methods well known in the art. Delamination is highly undesirable since it substantially reduces the thermal dissipation capabilities of the device and may provide an entrance path for atmospheric contaminants that reduce reliability.

It is believed that this delamination failure is related to the presence of a thin native oxide that forms on the copper containing leadframes when exposed to room air. Apparently, the bond between the plastic encapsulant and this thin native oxide is not as robust as the bond between the same encapsulant and bare metal. This native oxide is estimated to be about 0.001–0.004 micrometers thick. Many metals including copper and copper alloys are known to form such native oxides on exposure to ordinary air. The exact composition and thickness of this native oxide may vary depending upon the composition of the metal and the impurities present in the air since copper is known to be sensitive to the present of materials such as chlorine and moisture. Nevertheless, copper containing leadframes and especially substantially pure copper leadframes exposed to ambient air prior to encapsulation in a typical clean semiconductor assembly environment exhibit the above-described tendency to delaminate from plastic encapsulation.

The propensity for delamination is related to the contiguous area of the leadframe and/or die flag within the encapsulant that is relatively free of mechanical locking features, e.g., grooves, notches, and the like. In certain types of devices, shown for example in FIGS. 1–3, where the plastic encapsulation completely surrounds the entire die and heat removal flag, the area of comparatively smooth metal-plastic interface is larger than in devices where the plastic does not completely surround the heat removal flag. Hence, such devices have an increased tendency to delaminate. Although delamination can occur anywhere between the leadframe and the plastic, it frequently occurs on bottom surface 21 of die flag 20 since this is often the largest comparatively smooth featureless metal region. Such delamination is illustrated in FIG. 2.

It has been found that if the copper containing leadframes are pre-treated by exposure to an oxidizing ambient the weak native oxide can be strengthened so that an improved bond is obtained between the leadframe and the plastic encapsulant. Heating in an oxidizing atmosphere at high temperature is not suitable because the temperatures necessary to produce significant improvement in oxide strength also anneal the leadframes, especially the pure copper leadframes, so that they become soft and no longer suitable for their intended purpose.

It has been discovered that the native oxide, if any, can be strengthened and a good leadframe-plastic bond obtained if the leadframe is briefly chemically oxidized, i.e., through exposure of the leadframe to active (dissociated) oxidants. Excessive heat is not required to achieve such dissociation and oxidation. This treatment may be performed prior to die bonding and wire bonding since it has been found not to interfere with such operations, i.e., whatever surface change is provided by the described treatment it does not prevent or make more difficult the mounting of semiconductor die thereon or the bonding of various wires thereto by means well known in the art. This is a particularly useful feature of the present invention since it permits the process for improving plastic adhesion to the leadframe to be carried out before any sensitive semiconductor die or connecting wires are mounted thereon and without otherwise disturbing the assembly process. However, as long as the semiconductor or other components on the leadframe are not adversely affected by the active oxidant treatment, this step may be performed anytime prior to encapsulation.

$H_2O_2$ is found to be a suitable chemical oxidant. Immersion of copper leadframes in 10–30% water solutions of $H_2O_2$ for a few minutes at room temperature provides improved bonding strength and less delamination. Other diluents which provide dissociation of the $H_2O_2$ may also be used. Immersion times of 1–30 minutes are useful with 1–20 minutes being convenient and with 5–15 minutes being preferred. The treatment is believed to provide an oxide having a thickness in the range of about 0.005–0.05 micrometers. The treatment can be accelerated by heating the solution up to about the water boiling point, but the solution life is correspondingly decreased.

A preliminary degreasing step, prior to the chemical oxidation step, is desirable if the leadframes have been in an environment where they may have accumulated surface hydrocarbon films. A brief dip in isopropyl alcohol is suitable, but other well known degreasing treatments may also be used.

An oxygen containing plasma is also believed to be useful for improving the leadframe-plastic bond strength. The plasma provides an atmosphere in which oxidizing species are dissociated and available to rapidly react with the leadframe metal and/or native oxide. It is desirable to run the plasma at a power level where the leadframes remain relatively cool, i.e., well below the annealing temperature. In this respect, low pressure plasmas are particularly convenient but not essential.

For leadframes intended for use with semiconductor components, it is desirable to use plasma or solution oxidation treatments which are substantially chlorine free, since residual chlorine may adversely affect device reliability.

The above described process is more effective the higher the copper concentration in the leadframe metal, being useful for copper concentrations of about 50% or larger and particularly useful with substantially pure copper leadframes.

EXAMPLE

Leadframes were etched from Olin-194 type copper, which is well known in the art for use in leadframes, to provide a 3×9 array of squares on 0.5 inch (12.7 mm) centers. The leadframes were tested in the as-received (air exposed) condition and after a variety of treatments, e.g., exposure to UV-light produced ozone, application of organic adhesion promoters, and the above-described treatment in 30% $H_2O_2$. Plastic buttons of Nitto-MP180 type encapsulation plastic, also well known in the art, were then molded onto each square of the leadframes using conventional means. Pull tubes were attached by an epoxy cement to each molded plastic button. The molded plastic buttons were then pulled away from the copper and the required force measured. This is referred to as the pull strength. Approximately 200 samples from 14 mold shots were pull tested. The standard deviation of pull test values of a sample of ten specimens was typically about half of the mean value.

It was found that the untreated (air-exposed) control samples showed pull strength values in the range of about 1.5–5 pounds (6.7–22 Newtons) with an average of about 3.25 pounds (14.4 Newtons), while the $H_2O_2$ treated samples showed pull strengths in the range of about 7–13 pounds (31–58 Newtons) with an average of about 9.4 pounds (41.8 Newtons). All of the other treatments gave pull strength values in about the same range as the control samples. It is believed that the air-exposed control samples are representative of the condition of leadframes ordinarily used in manufacturing and which are also air-exposed. It was further found that there was a substantial decrease in the percentage of delamination failures after temperature cycling for devices assembled using leadframes that had received the above-described $H_2O_2$ treatment, as compared to device assembled using ordinary leadframes that had not received such treatment. The results of using the above-described $H_2O_2$ treatment are illustrated in FIG. 3 where no delamination occurred and void 32 did not form.

A further advantage of the present invention is that the low temperature oxidized leadframes of the present invention are not sensitive to variations in the time lag between treatment and use. This is in contrast, for example, to the prior art approach of using leadframes treated with organic oxidation inhibitors since air eventually penetrates the layer to the metal surface and leadframes treated in that way are sensitive to production delays.

A still further advantage of the above-described peroxide treatment occurs when used in conjunction with copper and/or copper alloy leadframes that are partially nickel coated, as for example by spot plating. Nickel is often used, for example, as a coating on the wire bond regions of the leadframe, e.g., location 28 in FIG. 1 where wire 26 attaches, and/or on exterior portions of leads 14, 16, 18. The nickel surface enhances bonding and/or solderability. It has been observed that in addition to providing improved plastic adhesion to the copper or copper alloy leadframe, the peroxide treatment simultaneously removes oxide and/or other corrosion products from the nickel surface. Removal of oxide and/or other corrosion products from the nickel surface improves bonding and/or soldering to the nickel surface. This combined nickel cleaning and improved plastic adhesion promotion effect on partially nickel coated leadframes is unexpected and particularly useful.

Having thus described the invention, it will be apparent to those of skill in the art that improved leadframe-plastic encapsulant bond strength is provided by the method of the present invention; that the invented method is particularly simple and effective and suitable for use with semiconductor components; that the improved bonding strength does not depend upon mechanical plastic locking features and works on smooth featureless surfaces; that the invented process is tolerant of native oxide that may be present on copper bearing leadframes that have been exposed to a typical electronic assembly ambient prior to encapsulation; that the invented method does not require pretreatment with reducing atmospheres or solutions or protection of the leadframe surface with organic monomers or the like; and further that the invented method does not interfere with the subsequent die bonding and/or wire bonding operations carried out on the leadframe after the invented treatment and before encapsulation and is insensitive to variations in time lapse between leadframe treatment and leadframe use.

We claim:

1. A method for reducing delamination in plastic encapsulated electrical components, comprising:
    providing a leadframe having a first portion for external connection and a second portion for receiving an electrical component, wherein parts of the second portion have exposed copper and exposed nickel;
    exposing the leadframe to a liquid or plasma oxidant at a temperature less than the leadframe annealing temperature to simultaneously oxidize the exposed copper and clean the exposed nickel in a single operation; and
    thereafter encapsulating the parts of the second portion in a plastic encapsulant.

2. The method of claim 1 wherein the providing step comprises providing a second portion wherein parts of the second portion have exposed bright copper and exposed nickel and the exposing step comprises exposing the leadframe to 10–30% $H_2O_2$ solution for a time in the range of 1–30 minutes.

3. The method of claim 2 wherein the time is in the range 5–15 minutes.

4. The method of claim 1 wherein the exposing step is performed at a temperature less than about 100° C.

5. The method of claim 1 wherein the oxidant is substantially chlorine free.

6. The method of claim 1 wherein the exposing step comprises exposing the leadframe to an oxygen containing plasma.

7. The method of claim 1 further comprising, prior to the exposing step, the step of degreasing the leadframe.

8. A method of encapsulating electronic devices on leadframes, comprising:
    providing a leadframe having substantially bare copper and substantially bare nickel that have been exposed to air;
    simultaneously further oxidizing the copper and cleaning the nickel by immersion in a nickel and copper oxidant in which nickel oxide is soluble at a temperature less than about 100° C.;

bonding a connecting lead to the nickel on the leadframe; and molding a plastic encapsulant in contact with a portion of the leadframe.

9. The method of claim 8 wherein the simultaneously further oxidizing the copper and cleaning the exposed nickel step comprises exposing the leadframe to a substantially free copper oxidant and nickel cleaning material.

10. The method of claim 8 wherein the simultaneously further oxidizing the copper and cleaning the exposed nickel step comprises exposing the leadframe to a 10–30% solution of $H_2O_2$.

* * * * *